(12) United States Patent
Miyake et al.

(10) Patent No.: US 8,587,137 B2
(45) Date of Patent: Nov. 19, 2013

(54) ELECTRICITY GENERATION DEVICE AND ELECTRICITY COLLECTION SYSTEM

(71) Applicant: Miyake Inc., Hiroshima (JP)

(72) Inventors: Masamitsu Miyake, Hiroshima (JP); Takaaki Mizukawa, Hiroshima (JP)

(73) Assignee: Miyake Inc., Hiroshima-Shi, Hiroshimo (JP)

( * ) Notice: Subject to any disclaimer, the term of this patent is extended or adjusted under 35 U.S.C. 154(b) by 0 days.

(21) Appl. No.: 13/652,703

(22) Filed: Oct. 16, 2012

(65) Prior Publication Data

US 2013/0099506 A1 Apr. 25, 2013

Related U.S. Application Data

(63) Continuation of application No. PCT/JP2011/002237, filed on Apr. 15, 2011.

(30) Foreign Application Priority Data

Apr. 16, 2010 (JP) ................................ 2010-095231

(51) Int. Cl.
- *F02B 63/04* (2006.01)
- *F03G 7/08* (2006.01)
- *H02K 7/18* (2006.01)

(52) U.S. Cl.
USPC ................................................ 290/1 R

(58) Field of Classification Search
USPC ................................................ 290/1 R, 1 A
See application file for complete search history.

(56) References Cited

U.S. PATENT DOCUMENTS 3,506,076 A * 4/1970 Angona ........................ 175/57

FOREIGN PATENT DOCUMENTS

| JP | 2006-166694 A | 6/2006 |
|----|---------------|--------|
| JP | 2008-232127 A | 10/2008 |
| JP | 2009-247209 A | 10/2009 |
| JP | 2010-074966 A | 4/2010 |
| WO | WO 2009/145745 A1 | 12/2009 |

OTHER PUBLICATIONS

International Search Report (PCT/ISA/210) issued on Jul. 19, 2011, by the Japanese Patent Office as the International Searching Authority for International Application No. PCT/JP2011/002237.
Written Opinion (PCT/ISA/237) issued on Jul. 19, 2011, by the Japanese Patent Office as the International Searching Authority for International Application No. PCT/JP2011/002237.

* cited by examiner

*Primary Examiner* — Javaid Nasri
(74) *Attorney, Agent, or Firm* — Buchanan Ingersoll & Rooney PC

(57) ABSTRACT

This invention provides an electricity generation device capable of generating electricity using kinetic energy generated by spontaneous behavior of an animal. The device includes a mechano-electric conversion mechanism that converts a displacement of a body part where the animal spontaneously moves (for example, a mouth) into an electric energy. For example, the mechano-electric conversion mechanism can have an arrangement for converting the displacement of the body part into rotation by a combination of a rack and a gear and rotating the rotor of a dynamo or an alternator.

6 Claims, 6 Drawing Sheets

(12) United States Patent — US 8,587,137 B2

ELECTRICITY GENERATION DEVICE AND ELECTRICITY COLLECTION SYSTEM

BACKGROUND OF THE INVENTION

1. Field of the Invention

The present invention relates to an electricity generation device and an electricity collection system, and more particularly, to an electricity generation device for generating electricity using an animal as a source of power and an electricity collection system for collecting the electricity generated by the electricity generation device.

2. Description of the Related Art

In recent years, electricity generation devices using natural energies have received a greater deal of interest as a means for reducing $CO_2$ output. A photovoltaic power generation device, a wind power generation device, a geothermal power generation device, a tidal power generation device, and the like have been known as electricity generation devices using natural energies. Many of them require a relatively large-scale device. On the other hand, there has been an interest in electricity generation devices that implement an electricity generation method called environmental energy harvesting or power harvesting using an environmentally existing energy such as a vibration or waste heat generated by a human's motion or a vehicle's movement. For example, Japanese Patent Laid-Open No. 2006-166694 proposes an electricity generation device for generating electricity by driving a piezoelectric element using sound vibration energy.

As an environmentally existing energy, energy generated by a motion of an animal, particularly a domestic animal, could be usable. Conventionally, however, there have only been proposed devices using a domestic animal only as a power source by, for example, attaching a mechanism for rotating a rotating shaft of a generator to a domestic animal and forcing it to walk in order to rotate the rotating shaft (Japanese Patent Laid-Open No. 2008-232127).

An electricity generation device as proposed in Japanese Patent Laid-Open No. 2008-232127 forces a specific individual into a specific action to achieve a certain objective, like causing a cow or a horse to plow a field or draw a cart, instead of utilizing the natural motion of a domestic animal. In such a method of causing a specific individual to make a specific motion, it is impossible to utilize kinetic energy generated by, for example, a spontaneous (natural) act such as feeding behavior of a cow grazing on a farm.

SUMMARY OF THE INVENTION

The present invention has been made in consideration of the problems of the related art, and provides an electricity generation device capable of generating electricity using kinetic energy generated by spontaneous behavior of an animal. The present invention also provides an electricity collection system for collecting the electricity generated by the electricity generation device according to the present invention.

According to one aspect of the present invention, there is provided an electricity generation device for generating electricity using an animal as a source of power, comprising a mechano-electric conversion mechanism that converts a displacement of a body part where the animal spontaneously moves into electric energy, and an accumulation unit that accumulates the electric energy converted by the mechano-electric conversion mechanism.

According to another aspect of the present invention, there is provided an electricity collection system comprising an electricity generation device of the present invention, which further comprises a feed unit that externally outputs the electric energy accumulated by the accumulation unit, a reception unit that receives the electric energy from the feed unit, and an electricity collection unit that accumulates the electric energy received by the reception unit.

Further features of the present invention will become apparent from the following description of exemplary embodiments (with reference to the attached drawings).

DESCRIPTION OF THE EMBODIMENTS

Exemplary embodiments of the present invention will now be described with reference to the accompanying drawings. In the following embodiments, a cow will be given as an example of an animal to which an electricity generation device according to the present invention can suitably be applied. However, the animal to which the electricity generation device according to the present invention is applicable is not limited to a cow. In principle, the device is applicable to any given animal that performs as its natural behaviors such as moving its mouth when feeding, making a raising/lowering head motion, making a respiratory movement, or the like.

First Embodiment

Figure 1A:
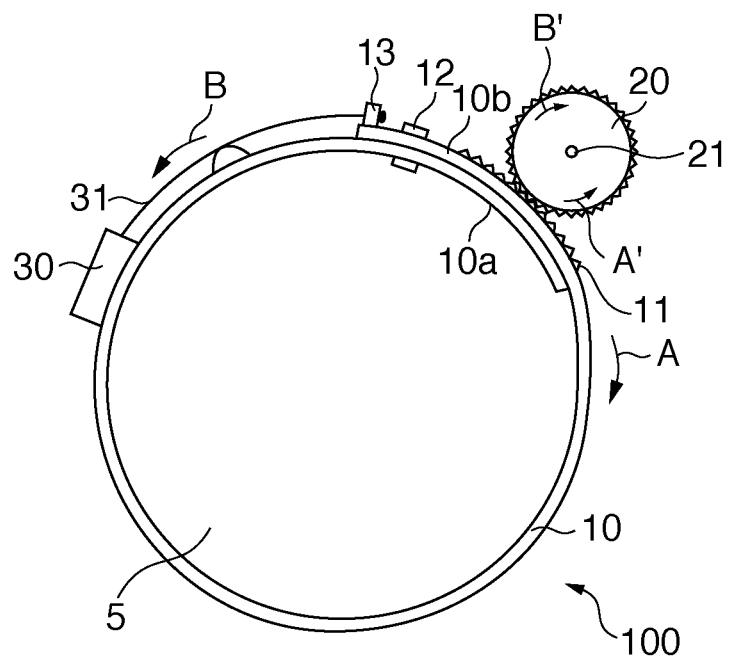
FIG. 1A is a view schematically showing an arrangement example when the mechanism of an electricity generation device according to the first embodiment of the present invention is applied to a muzzle.

FIG. 1A is a view schematically showing an arrangement example wherein the mechanism of an electricity generation device according to the first embodiment of the present invention is applied to a muzzle.

The electricity generation device according to the present invention uses a mechano-electric conversion mechanism as a generator. In this embodiment, a dynamo or an alternator is used as the mechano-electric conversion mechanism to generate electricity. In addition, the rotor of the dynamo or alternator is rotated using the displacement of a mouth in a mouth motion at the time of feeding (including rumination) as an example of a spontaneous motion of an animal, thereby generating electricity. However, the spontaneous motion of an animal is not limited to the mouth motion at the time of feeding, and can be an arbitrary spontaneous motion such as a head motion at the time of feeding, a foot motion during movement, or an abdomen or chest motion for respiration.

Note that in this specification, the mechano-electric conversion mechanism means a mechanism capable of converting a mechanical displacement such as a movement or rotation of a body part of an animal into an electric energy. In this embodiment, the rotor of the dynamo or alternator is rotated by a displacement of a mouth (jaws) in a mouth motion, thereby generating electricity corresponding to the rotation amount.

Referring to FIG. 1A, a muzzle 100 includes a main body 10 obtained by forming a strip of an elastic material—for example, a metal—into a ring. The main body 10 is configured such that ends 10a and 10b are relatively movable and partially overlap. The ends 10a and 10b are relatively movable in directions to make the overlap portion larger or smaller. A stopper 12 and a guide 15 (see FIG. 2A) are provided to restrict the directions and range of the relative movement of the ends 10a and 10b. A rack 11 is formed on the outer surface of the end 10b.

A gear 20 is a spur gear or a pinion, and is configured to mesh with the rack 11. A shaft 21 of the gear 20 is attached to an arbitrary position so as to rotate as the end 10b moves. The shaft 21 of the gear 20 gives a power to rotate the rotating shaft of a generator included in an electricity generation module (not shown). The shaft 21 can be the rotating shaft of the generator itself or give a power to the rotating shaft of the generator via another gear for accelerating or decelerating the rotation of the shaft 21.

A restoration mechanism 30 is provided at a position on the outer surface of the main body 10, which is not included in an overlap portion even when the diameter of the main body 10 is minimized and facing the gear 20 with the stopper 12 being therebetween. The restoration mechanism 30 is a mechanism that biases the end 10b to the side of the restoration mechanism 30 (the direction of an arrow B in FIG. 1A) to restore (decrease) the diameter of the main body 10 that is extended when the cow opens its mouth.

In this embodiment, the restoration mechanism 30 biases one end of a wire 31 having the other end connected to a distal end 13 of the end 10b of the main body in the direction of the arrow B by the force of a spiral spring (not shown). Like a so-called spring-type auto reel, the restoration mechanism 30 can have an arrangement that includes a rotating member on which the other end of the wire 31 is wound and biases the rotating shaft of the rotating member by the spiral spring. Hence, the spiral spring is tightened by the force of the cow's mouth to extend the main body 10. When the cow closes its mouth, and the force to extend the main body 10 is eliminated, the rotating member rotates due to the restoring force of the spiral spring to wind up the wire 31 and bring back the end 10b in the direction of the arrow B.

When putting the muzzle 100 on an animal—a cow in this case—it is put on so that the cow's nose comes out of a hollow portion 5 so that the main body 10 of the muzzle 100 is extended (the diameter of the main body 10 is increased) by the force of opening the mouth at the time of mastication. The end 10a is preferably fixed at a predetermined position around the cow's mouth by, for example, fixing the end 10a to another harness so that the diameter of the muzzle 100 is increased substantially solely by the movement of the end 10b. Note that the diameter of the main body 10 is preferably adjusted not to tighten the cow's mouth more than necessary in the closed state (minimum diameter state) of the muzzle 100.

Figure 1B:
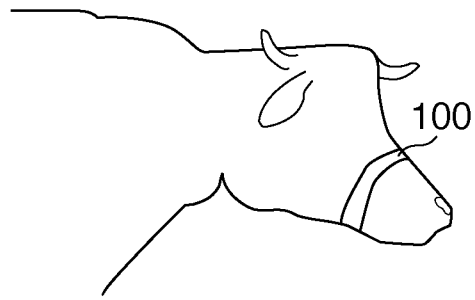
FIG. 1B is a view schematically showing a state in which the muzzle 100 shown in FIG. 1A is put on a cow.
Figure 1C:
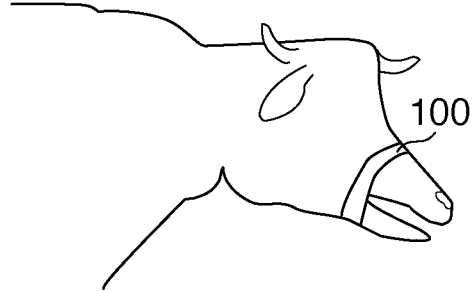
FIG. 1C is a view schematically showing a state in which the muzzle 100 shown in FIG. 1A is put on a cow.

FIGS. 1B and 1C schematically show a state in which the muzzle 100 is put on a cow. FIG. 1B shows a state in which the mouth is closed, and FIG. 1C shows a state in which the mouth is open.

Figure 2A:
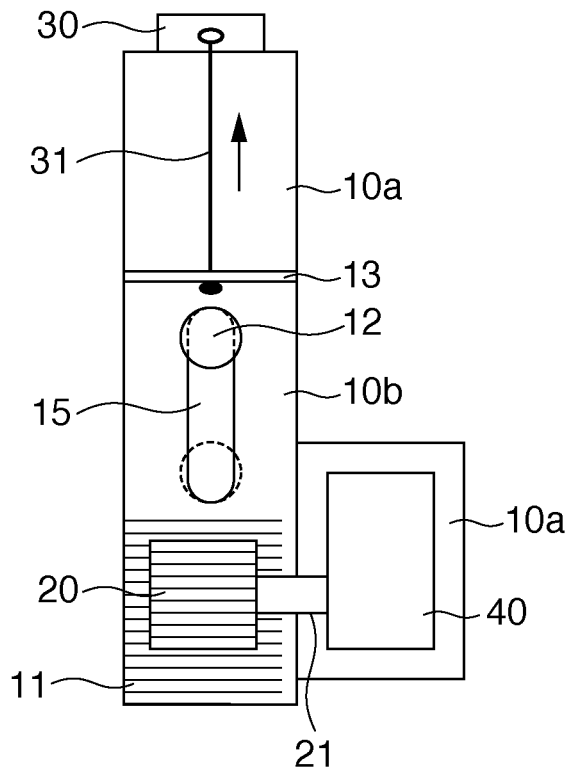
FIG. 2A is a view showing an arrangement example of the muzzle 100 in FIG. 1A when viewed from the upper side.

FIG. 2A schematically shows a state in which the muzzle 100 is viewed from the upper side. The state shown in FIG. 2A is a state in which the diameter of the muzzle 100 is maximized. As described above, the directions and range of the relative movement of the ends 10a and 10b of the muzzle 100 are restricted by the stopper 12 and the guide 15. The guide 15 is a slot provided in the end 10b. The stopper 12 extends through the guide 15 and is fixed to the end 10a. The stopper 12 has a cylindrical shape whose horizontal section has a diameter close to the width (the length in the leftward/rightward direction of FIG. 2A) of the guide 15, and is movable along the guide 15. A position indicated by a dotted line corresponds to the minimum diameter state of the muzzle 100.

The length of the guide 15 is preferably decided in accordance with the mouth motion at the time of feeding of the animal on which the muzzle 100 is put. If too short, the guide 15 impedes the feeding behavior of the animal. Hence, the length of the guide 15 is preferably at least equal to or more than the maximum variation of the circumferential length of the mouth in the feeding behavior of the animal on which the muzzle is put.

The change in the circumferential length of the cow's mouth at the time of feeding was measured as about 3 to 5 cm. For this reason, for the muzzle 100 to be put on a cow, the guide 15 preferably has a length of at least 5 cm. This is merely an example and is not intended to limit the length of the guide 15.

An electricity generation module 40 is connected to the shaft 21 of the gear 20. The electricity generation module 40 may be arranged on a portion of the outer surface of the end 10a partially extended in lateral direction, as shown in, for example, FIG. 2A, or on another place. For example, the electricity generation module 40 may be arranged above the gear 20. In this case, the gear 20 is attached to the case of the electricity generation module 40, and the power of the shaft 21 of the gear 20 is transmitted to the generator via another gear. Actually, the portions of the gear 20, the electricity generation module 40, and the rack 11 are preferably covered with a weather-resistant cover independently of the arrangement position of the electricity generation module 40.

Figure 2B:
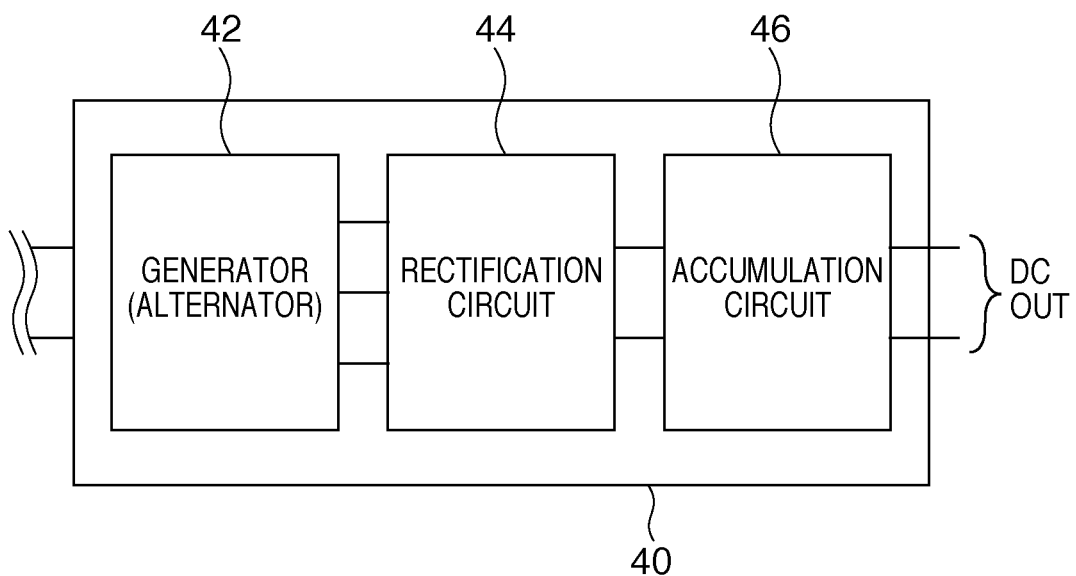
FIG. 2B is a block diagram showing an example of the functional arrangement of an electricity generation module 40.

As shown in FIG. 2B, the electricity generation module 40 includes a generator 42, a rectification circuit 44, and an accumulation circuit 46. In this embodiment, a dynamo (DC output) or an alternator (three-phase AC output) is used as the generator 42, as described above. An alternator is preferably used from the viewpoint of electricity generation efficiency. Note that in this embodiment, a compact alternator used in a commercially available so-called hand generator is suitably usable.

The rectification circuit 44 is a circuit that rectifies the voltage output from the generator 42 and outputs a DC voltage of the same polarity. A known full-wave rectification circuit can be used as the rectification circuit 44. The rectification circuit 44 may include a regulator or a smoothing circuit.

The accumulation circuit 46 is a circuit that accumulates the DC voltage output from the rectification circuit 44 as charges. As the accumulation circuit 46, a secondary battery or a capacitor can be used. For example, a capacitor having a large capacity such as an electric double layer capacitor can be suitably used.

When the cow starts opening the closed mouth, a force to extend the muzzle 100 vertically from inside (hollow portion 5) is applied to the muzzle 100. The ends 10a and 10b that are movable portions thus relatively move to increase the diameter of the muzzle 100. When the end 10b moves, the rack 11 moves in the direction of an arrow A in FIG. 1A to rotate the gear 20 in the direction of an arrow A'. The generator 42 in the electricity generation module 40 thus generates electricity, and the accumulation circuit 46 accumulates the electricity. The larger the moving amount of the end 10b is, the larger the rotation amount of the gear 20, that is, the electricity generation amount is. For this reason, the muzzle 100 is preferably put not to move the end 10a, as described above. The force of increasing the diameter of the muzzle 100 simultaneously tightens the spiral spring included in the restoration mechanism 30.

The increase in the diameter of the muzzle 100 stops when the cow has completely opened the mouth, or the diameter has reached the extension amount restricted by the stopper 12. When the cow starts closing the mouth, the force of increasing the diameter of the muzzle 100 is not applied any more. The force of the spiral spring of the restoration mechanism 30 to wind back the wire 31 starts restoring (starts decreasing) the diameter of the muzzle 100. When the end 10b is drawn back by the wire 31 in the direction of the arrow B, the rack 11 rotates the gear 20 in the direction of an arrow B' (the direction reverse to that when increasing the diameter). The generator 42 in the electricity generation module 40 thus generates electricity, and the accumulation circuit 46 accumulates the electricity.

As described above, the rack 11 rotates the gear 20 both when increasing and decreasing the diameter of the muzzle 100. Hence, efficient electricity generation can be performed. For example, the mastication count of a ruminant such as a cow is several tens of thousands a day. For this reason, although the electricity generation amount at a time is small, a sufficient accumulation effect can be expected.

A cow ruminates almost once per sec. Hence, a circuit that consumes power smaller than the electricity generation amount of one ruminate can continuously operate. For example, a wireless module of IEEE802.15.4 (PAN) that operates at an operating voltage of about 2 V and consumes 2 to 3 mA (4 to 6 mW) on the average can sufficiently operate. For this reason, when the electricity generation device of the present invention is used to supply power to, for example, an oscillator attached to a cow to monitor its state from a remote site, a battery exchange operation required so far becomes unnecessary. It is also possible to solve the problem of a failure in information acquisition caused by battery exhaustion.

An electricity collection system may be constructed by collecting, at a specific place, charges accumulated in the accumulation circuit 46. For example, when the electricity generation devices are attached to cows in the grazing land, an electricity collection apparatus may be provided at a place such as a cowshed or a watering place where the cows gather to extract charges from the accumulation circuit 46 of the electricity generation device of each cow that has returned to the cowshed and accumulate the charges in an accumulation circuit having a larger capacity. In this case, the accumulation circuit 46 is provided with, for example, a terminal to externally read the charges.

Figure 3A:
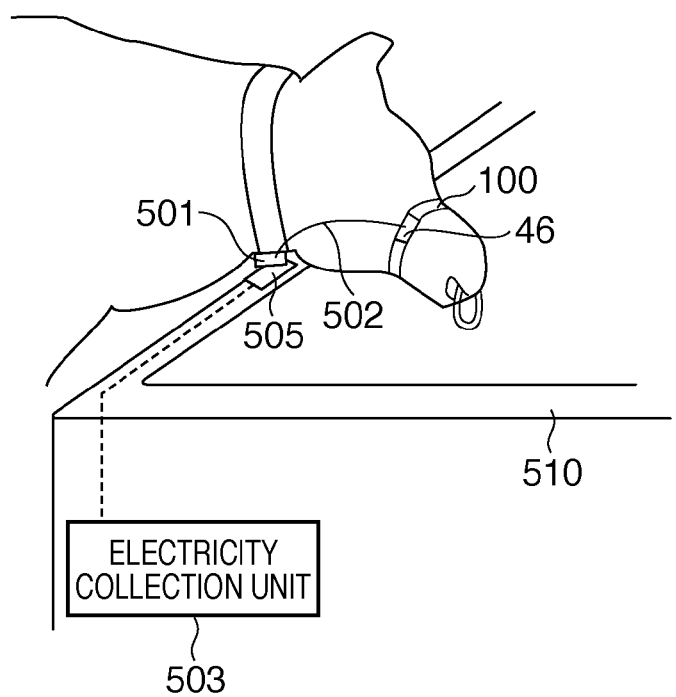
FIG. 3A is a view schematically showing an arrangement example concerning electricity transmission/reception in an electricity collection system for collecting electricity from the electricity generation device according to the first embodiment of the present invention.
Figure 3B:
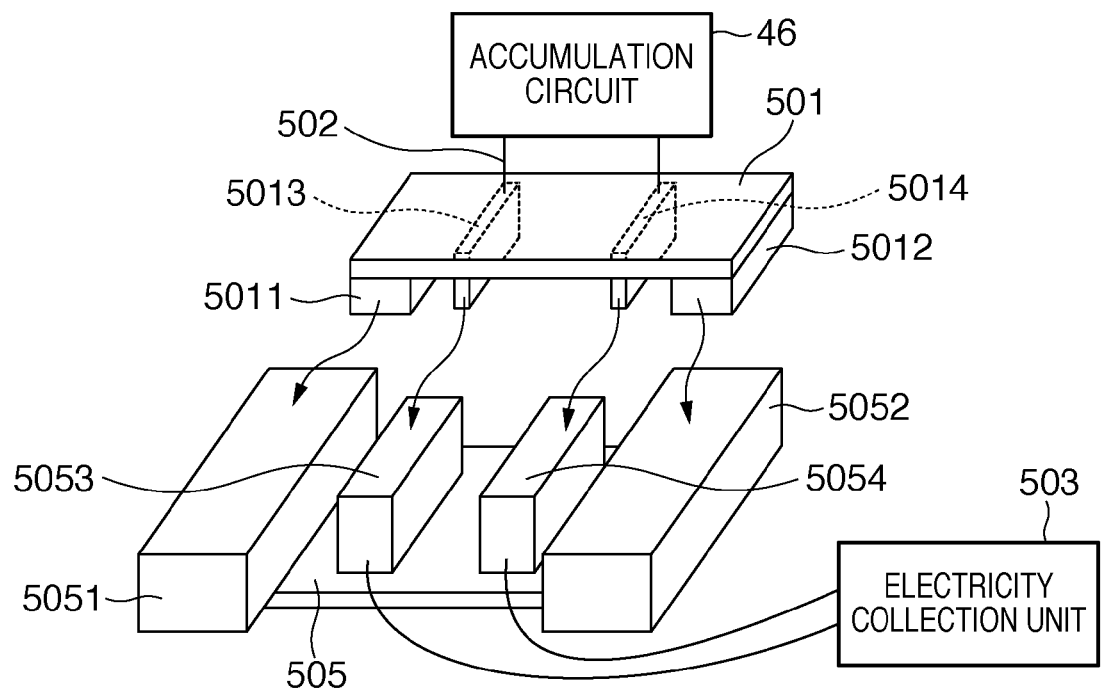
FIG. 3B is a view schematically showing an arrangement example concerning electricity transmission/reception in an electricity collection system for collecting electricity from the electricity generation device according to the first embodiment of the present invention.

FIGS. 3A and 3B are views schematically showing an arrangement example concerning electricity transmission/reception in such an electricity collection system for collecting electricity at a feeding place or a watering place. As shown in FIG. 3A, a reception electrode 505 of the collection mechanism is arranged at the edge of a trough of water or forage. A feed electrode 501 provided at the lower portion of the collar of the cow is electrically connected to the reception electrode 505 when the cow lowers the head. The accumulation circuit 46 is connected to the feed electrode 501 via a wiring cable 502. When the feed electrode 501 and the reception electrode 505 are electrically connected, charges accumulated in the accumulation circuit 46 are supplied to an electricity collection unit 503 via the feed electrode 501 and the reception electrode 505. For example, a plurality of reception electrodes 505 are connected to the electricity collection unit 503. Charges supplied from each reception electrode 505 can be, for example, accumulated in a capacitor having a large capacitance, used to charge a secondary battery, or used as the power supply of another device. Since the arrangement of the electricity collection unit 503 can appropriately be determined in accordance with the application purpose of the collected charges, and an arbitrary and known arrangement is usable, a detailed description thereof will be omitted.

FIG. 3B is a view schematically showing an arrangement example of the feed electrode 501 and the reception electrode 505. An example is illustrated in which when the feed electrode 501 and the reception electrode 505 are attracted by a magnetic force, they are electrically connected as the terminals provided on the electrodes come into contact. The feed electrode 501 having a rectangular shape has a set of magnets 5011 and 5012 at the ends of two opposed sides. A set of plate-shaped feed terminals 5013 and 5014 are provided almost at the center of the feed electrode 501 and connected to the accumulation circuit 46.

The reception electrode 505 has an arrangement similar to that of the feed electrode 501, that is, has a set of magnets 5051 and 5052 and a set of reception terminals 5053 and 5054. The reception terminals 5053 and 5054 are connected to the electricity collection unit 503. The reception terminals 5053 and 5054 have a wide shape to be contactable with the feed terminals 5013 and 5014 even if a slight misalignment occurs.

When the cow lowers the head to take water or forage in the trough, the feed electrode 501 provided at the lower portion of the collar to face downward comes close to the reception electrode 505 provided on the edge of the trough, and the magnets 5011 and 5051 and the magnets 5012 and 5052 are attracted by the magnetic force. The feed terminals 5013 and 5014 thus come into contact with the reception terminals 5053 and 5054, and charges are supplied from the accumulation circuit 46 to the electricity collection unit 503. Note that the trough may be configured to restrict the position where the cow can lower the head by providing a partition on the edge of the trough so that the feed electrode 501 and the reception electrode 505 can be attracted correctly.

Note that the arrangement shown in FIGS. 3A and 3B is merely an example on both the feed side and the reception side. A general arrangement used for electricity transmission/reception can be used. For example, a noncontact feed/reception circuit using electromagnetic induction or electromagnetic resonance as in a portable electronic device or an electric shaver may be used. In this case, the feed-side circuit can operate using the electricity from the accumulation circuit 46. However, to reduce the power consumption, the circuit is preferably configured to start the operation when it has approached the reception circuit to such a distance that enables electricity transfer. The arrangement for detecting the approach to the reception circuit is preferably mechanical from the viewpoint of suppressing the power consumption. A physical switch that is pressed and turned on at the time of approach, or a switch that is turned on by a magnetic force at the time of approach is usable.

The feed electrode 501 is provided on the collar to collect electricity when the cow lowers the head. However, if the position of a specific part of the cow at a specific place can be limited, the feed electrode may be provided at the specific part, and the reception electrode may be provided at the opposed position.

Note that since power supply is not stable until the output voltage of the accumulation circuit 46 reaches some degree, and the torque for rotating the gear 20 is also large, the use sometimes preferably starts after the accumulation circuit 46 has accumulated charges to some extent.

(First Modification)

Figure 4:
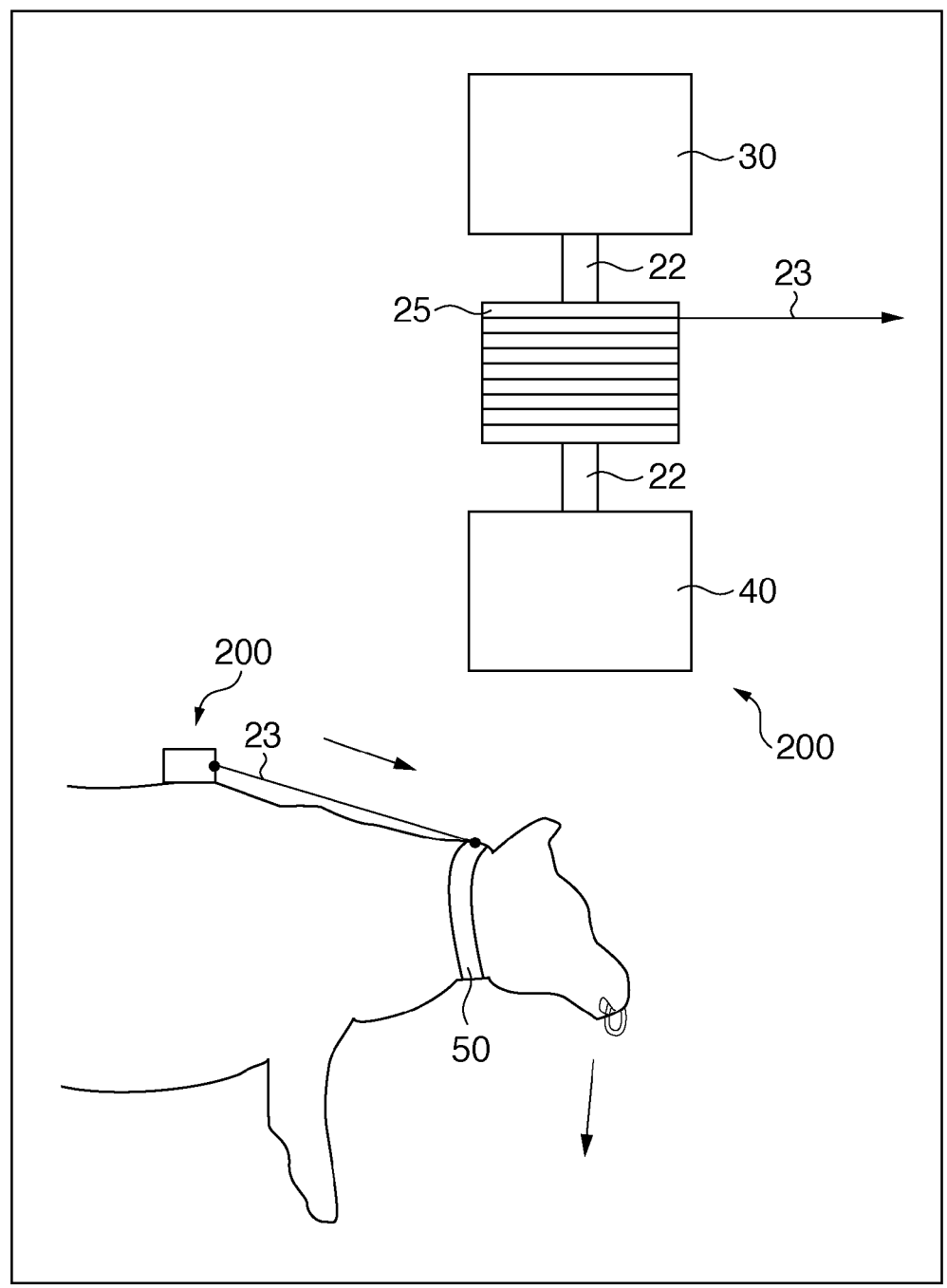
FIG. 4 is a view showing a modification of the electricity generation device according to the first embodiment of the present invention.

FIG. 4 is a view showing an electricity generation device 200 according to a modification of the embodiment. In this modification, electricity is generated using not an energy generated by a mouth motion at the time of feeding but an energy generated by a head motion at the time of feeding.

The electricity generation module 40 can have the same arrangement. Unlike the above-described arrangement, the mechanism for rotating the rotor of the generator 42 in the electricity generation module 40 includes not the combination of the gear 20 and the rack 11 but a rotation member 25 having an almost cylindrical shape and a wire 23 wound around the rotation member 25, and the restoration mechanism 30 directly rotates back a shaft 22 of the rotation member 25.

In this modification, the electricity generation device 200 is put at a fixed position on, for example, the back of a cow by a harness or the like. An end of the wire 23 is attached to a collar 50 on the neck that is a movable part. When the cow moves for feeding and lowers the head, the wire 23 is pulled in the direction of the arrow by the force, and the rotation member 25 with the wire 23 wound around it rotates.

One shaft 22 of the rotation member 25 rotates the rotor (not shown) of the generator 42 in the electricity generation module 40. The other shaft 22 tightens a spiral spring (not shown) in the restoration mechanism 30. The frequency of vertical motions of the head is not so high as that of rumination action. However, since the moving amount of the wire 23 by the vertical head motion is large, the electricity generation amount in one action is large. In addition, the force generated by the vertical head motion is larger than the force by rumination. Hence, the dynamo or alternator (and the accumulation circuit 46) used as the generator 42 may be a slightly larger one that needs a larger torque. This allows to further increase the electricity generation amount. However, since the torque necessary for the restoration mechanism 30 to wind up the wire 23 also increases, a measure of, for example, changing the spiral spring in the restoration mechanism 30 to a stronger one is taken into consideration as needed.

When the cow raises the head, the force in the direction to draw the wire 23 is eliminated. The shaft 22 of the rotation member 25 is rotated by the spiral spring in the restoration mechanism 30 to wind up the wire 23. At this time as well, as the shaft 22 rotates, the rotor of the generator 42 rotates, and electricity is generated.

The arrangement of this modification need only extract the force in the direction to draw the wire 23. Hence, the distal ends of the wire 23 can be attached to arbitrary movable portions such as the tail and back other than the combination of the back and neck to put the electricity generation device 200 at an arbitrary fixed portion.

(Second Modification)

Figure 5A:
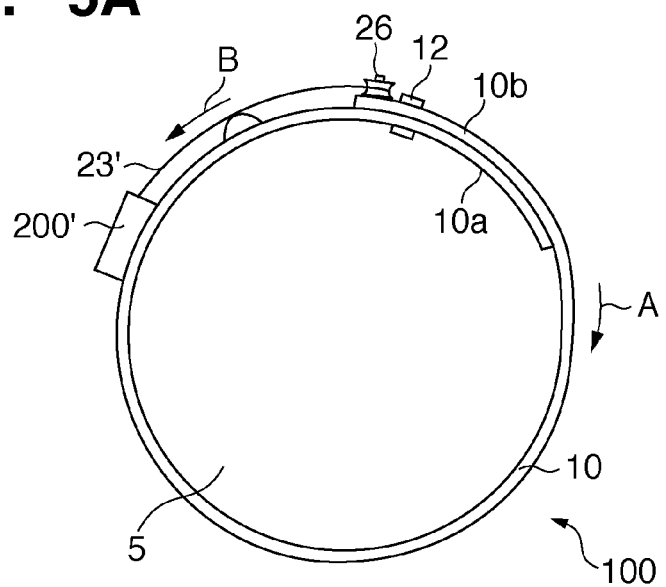
FIG. 5A is a view showing another modification of the electricity generation device according to the first embodiment of the present invention.
Figure 5B:
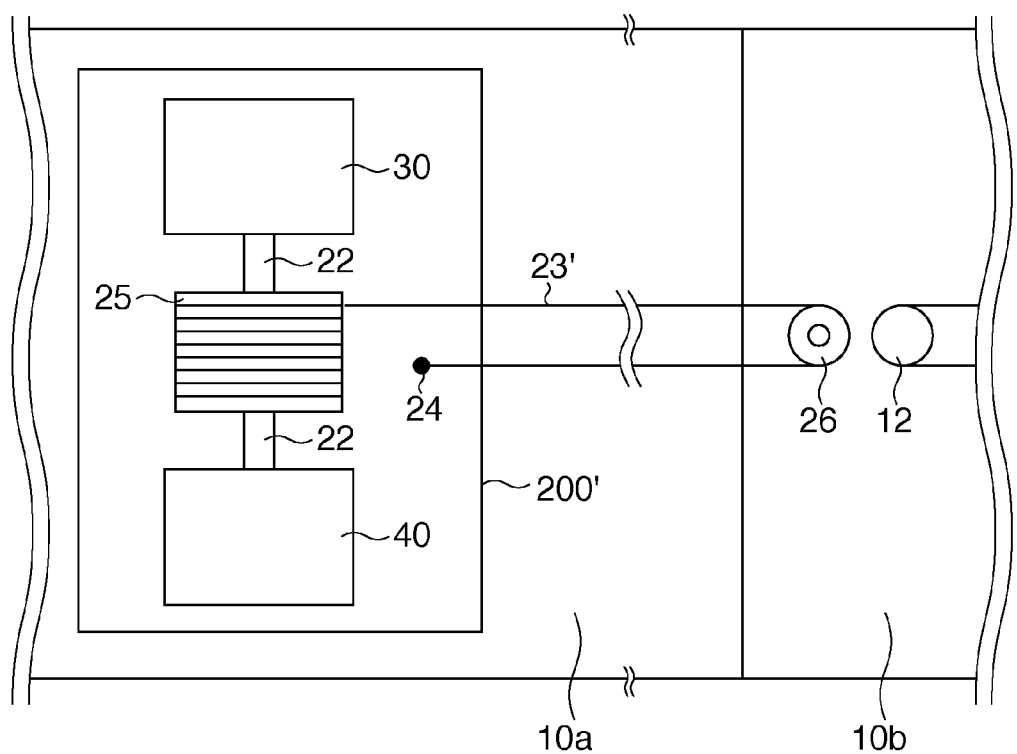
FIG. 5B is a view showing still another modification of the electricity generation device according to the first embodiment of the present invention.

FIGS. 5A and 5B are views showing another modification of the embodiment. FIG. 5A is a front view, and FIG. 5B is a plan view of main part.

This modification is a combination of the arrangement in FIG. 1A and part of the arrangement in FIG. 4. That is, an electricity generation module 200' having an arrangement similar to that of the electricity generation device 200 of the first modification is arranged on the outer surface of the main body 10 having a ring shape as in FIG. 1A. One end of a wire 23 having the other end wound around the rotation member 25 is fixed on the outer surface of the main body 10 such that the wire 23' is drawn from the rotation member 25 as the diameter of the main body 10 changes (increases) due to the displacement of the mouth of an animal.

More specifically, in the example shown in FIGS. 5A and 5B, a wire guide 26 is provided on the outer surface of the end 10b facing the electricity generation module 200' via the end. The wire 23' wraps around along the outer surface of the wire guide 26, and is fixed at a predetermined position (in this case, a predetermined position in the electricity generation module 200') 24 on the outer surface of the end 10a of the main body 10.

At least a portion of the wire guide 26 where the wire 23' contacts is formed to have a curved surface so that the wire 23' can smoothly moves along the outer surface. The wire guide 26 can be a fixed member such as a cylindrical post or a rotatable member such as a pulley. In the example shown in FIGS. 5A and 5B, the wire guide 26 is a rotatable member.

Note that instead of making the other end of the wire 23' wrap around using the wire guide 26, the wire may be connected to the distal end 13 of the end 10b of the main body 10, as shown in FIG. 1A. However, when the wire 23' wraps around, a moving amount of the wire 23' corresponding to twice the relative moving amount of the ends 10a and 10b can be obtained. This allows increasing both the rotation amount of the rotor and the electricity generation efficiency.

As described above, according to this embodiment, the generator is operated using kinetic energy generated by spontaneous (autonomous) behavior of an animal such as a domestic animal. Hence, the animal need not be forced into a specific behavior, and electricity generation can be done using unspecified many animals.

Second Embodiment

The second embodiment of the present invention will be described next. As a characteristic feature of this embodiment, a piezoelectric element is used as a mechano-electric conversion mechanism.

Figure 6A:
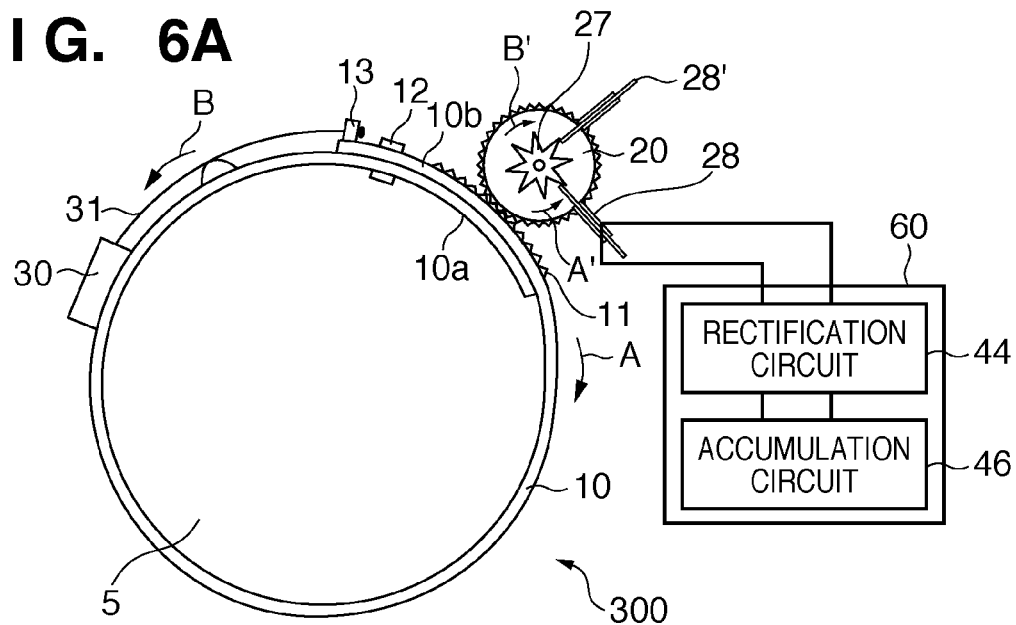
FIG. 6A is a view schematically showing an arrangement example when the mechanism of an electricity generation device according to the second embodiment of the present invention is applied to a muzzle.

FIG. 6A is a front view showing an arrangement example of an electricity generation device according to this embodiment. The same reference numerals as in the first embodiment shown in FIG. 1A denote the same elements, and a description thereof will not be repeated.

As is apparent from comparison between FIG. 1A and FIG. 6A, the second embodiment is the same as the first embodiment in that the electricity generation device has the form of a muzzle 300, and a gear 20 is rotated using an energy generated by a mouth motion of an animal at the time of feeding.

The second embodiment is different from the first embodiment in that a gear 27 having a small diameter is attached to the shaft of the gear 20, a piezoelectric element 28 formed into a cantilever (having a cantilever structure) so that an end comes into slight contact with the distal end of a tooth of the gear 27 is arranged, and no generator 42 is provided.

As is known, a piezoelectric element is a passive element using a piezoelectric material, and outputs a voltage corresponding to stress applied to the piezoelectric material. In this embodiment, the gear 27 coaxial to the gear 20 is provided as a mechanism for bending the movable end of the piezoelectric element 28 formed into a cantilever repetitively upward or downward as the gear 20 rotates. The fixed end of the piezoelectric element 28 may be fixed to, for example, a cover (not shown) that covers the portions of the gear 20, the gear 27, and a rack 11 and is fixed to a main body 10 (for example, end 10a). As described above, in this embodiment, the piezoelectric element 28 is deformed indirectly via the gear 20 (gear 27) by the displacement of the mouth.

The gear 27 applies stress to the movable end of the piezoelectric element 28 in the upward or downward direction by the distal end of a tooth. When the bend of the piezoelectric element 28 has reached a predetermined magnitude, the movable end of the piezoelectric element 28 is released to restore a state without bend. The teeth of the gear 27 intermittently repetitively apply stress to the movable end of the piezoelectric element 28 and release it as the gear 20 rotates. A voltage corresponding to the rotation amount of the gear 20 (27) is thus extracted from the piezoelectric element 28 and accumulated in an accumulation unit 60. The bend amount of the piezoelectric element 28 at a time is determined by the size of the overlap region between a tooth and a piezoelectric element when the tooth of the gear 27 comes into contact with the movable end of the piezoelectric element 28 (without applying stress). The bend amount can appropriately be determined in consideration of the fact that when the positional relationship between the gear 27 and the piezoelectric element 28 is decided such that the bend amount becomes large, the torque necessary for rotating the gear 27 (gear 20) becomes large, and when a bend amount more than the elastic limit of the piezoelectric element 28 is given, the piezoelectric element 28 breaks.

The piezoelectric element 28 may have a structure formed by, for example, attaching piezoelectric materials to both surfaces of an elastic base (metal plate or resin film). The thickness, rigidity, and the like of the piezoelectric element 28 are set such that it resonates when its free end is released and vibrates. This allows increasing the deformation amount of the piezoelectric element 28 and improving the electricity generation efficiency.

The accumulation unit 60 rectifies the voltage generated by the piezoelectric element 28 and accumulates it. A rectification circuit 44 can be, for example, a full-wave bridge rectification circuit. An accumulation circuit 46 can be a capacitor.

How to put the muzzle 300 and the rotating operation of the gear 20 along with the mouth motion of the animal on which the muzzle is put are the same as those described in the first embodiment, and a description thereof will be omitted. According to this embodiment as well, the same effect as in the first embodiment can be obtained. An arrangement using one piezoelectric element 28 has been explained above with reference to FIG. 6A for the descriptive convenience. Two piezoelectric elements 28 may be juxtaposed by providing another similar gear 27 on the backside of the gear 20. As indicated by a piezoelectric element 28' in FIG. 6A, more piezoelectric elements can be provided by attaching the fixed end at another position.

(First Modification)

Figure 6B:
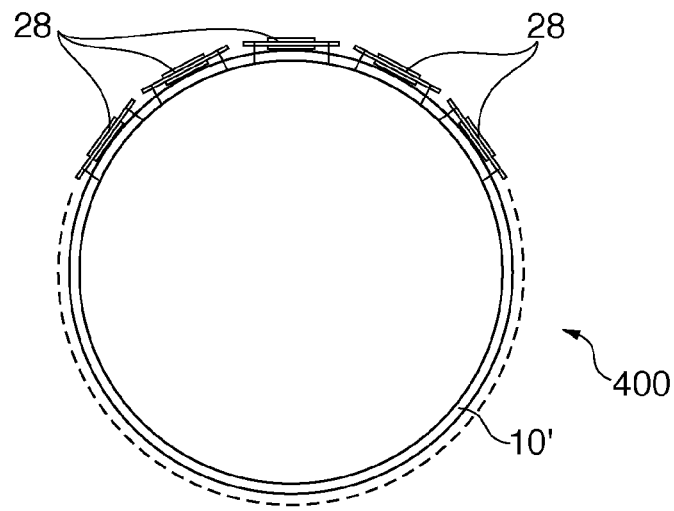
FIG. 6B is a view schematically showing a modification of FIG. 6A.

FIG. 6B is a view showing a modification of the electricity generation device according to the second embodiment of the present invention. The electricity generation device shown in FIG. 6B is the same as the arrangement shown in FIG. 6A in generating electricity using a piezoelectric element but different in the rest of the arrangement.

A main body 10' has a seamless ring shape. In the form including the rack 11 (first embodiment (FIG. 1A) and second embodiment (FIG. 6A)), the main body 10 is made of a material such as a metal having relatively high rigidity and elasticity so that the force by the mouth motion efficiently moves the ends 10a and 10b. In the modification, however, the force by the mouth motion directly bends the piezoelectric element 28 having two ends fixed to the main body 10'. Hence, the main body 10 is made of a material such as a rubber-like material that bends and stretches.

Instead of forming the piezoelectric element 28 into a cantilever, a plurality of piezoelectric elements 28 are arranged on the outer surface of the main body 10' while fixing two ends of each element to the main body 10' by wire-shaped attachment members 29. Note that a material having a high tensile rigidity is used for the attachment member 29 to efficiency transmit the bend of the main body 10' to the piezoelectric elements 28. In the example shown in FIG. 6B, the piezoelectric elements 28 are provided all over the outer surface of the main body 10' (the dotted line indicates that the piezoelectric elements 28 are arranged in a similar manner). However, the piezoelectric elements 28 need not always be attached all around, and may be arranged, for example, only at portions in contact with the upper surface of the upper jaw and the lower surface of the lower jaw.

Note that the accumulation unit 60 may be arranged in an extended area of a part of the main body 10', like the electricity generation module 40 shown in FIG. 2A, or attached at a predetermined position of the harness different from the main body.

Figure 6C:
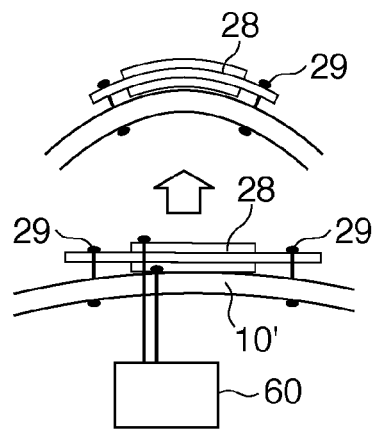
FIG. 6C is a view schematically showing a state in which a piezoelectric element deforms in the arrangement shown in FIG. 6B.

As in the first embodiment, the muzzle 300 is put while making the mouth come out of a hollow portion 5. When the animal (for example, cow opens the mouth, the main body 10' and the piezoelectric elements 28 deform due to the mouth motion, as shown in FIG. 6C, and a voltage is generated by the piezoelectric elements 28. Note that the deformation of the piezoelectric elements 28 need not always be bend and may be stretch, as a matter of course. According to this modification as well, the same effect as in the first and second embodiments can be obtained.

(Second Modification)

Even in the arrangement of this embodiment, the same arrangement as in the first modification (FIG. 4) of the first embodiment is applicable.

Other Embodiments

In the above embodiments, an arrangement for generating electricity using a mouth motion or a head motion at the time of feeding as a power has been described. However, when, for example, an abdomen or chest motion for respiration is used as a power, the same effect as described above can be expected by, for example, putting the ring-shaped main body 10 or 10' on the barrel of the animal.

In the arrangement shown in FIG. 4, even when the other end of the wire 23 is attached to a body part other than the neck, for example, another body part such as a foot or a tail, the same effect as described above can be expected.

Note that in the above-described embodiments, a dynamo, an alternator, a piezoelectric element, and the like have been exemplified as a mechano-electric conversion mechanism. However, any other known mechano-electric conversion mechanism is also usable, as a matter of course. For example, an electret generator may be used as a mechano-electric conversion mechanism, and an electret electrode or a counter electrode may be moved by a mechanical displacement such as movement or rotation of a body part of an animal.

For example, in the arrangement of the first embodiment, one electrode of the electret generator is attached to the side of the end 10a, and the other electrode is attached to the side of the end 10b. This enables to relatively move the electrodes bidirectionally to generate electricity.

Alternatively, in the arrangement of the second embodiment, an electret generator module (vibration electricity generation) may be used in place of the piezoelectric element 28. For example, in FIG. 2A, an element including an electret generator module arranged on an elastic plate such as a metal piece is supported as a cantilever, like the piezoelectric element 28, and flicked by causing the gear 27 to apply stress to the movable end in the upward or downward direction, thereby vibrating the vibration generator module. The output of the vibration generator module is input to the rectification circuit 44, like the output of the piezoelectric element 28. There is a frequency suitable for the vibration generator module. Hence, the vibration generator module is preferably configured to vibrate at an appropriate frequency by adjusting the arrangement position of the vibration generator module, the rigidity and length of the elastic plate, and the like.

The present invention is not limited to the above embodiments and various changes and modifications can be made within the spirit and scope of the present invention. Therefore, to apprise the public of the scope of the present invention, the following claims are made.

This application claims the benefit of Japanese Patent Application No. 2010-095231, filed Apr. 16, 2010, which is hereby incorporated by reference herein in its entirety.

What is claimed is:

1. An electricity generation device for generating electricity using an animal as a source of power comprising:
a mechano-electric conversion mechanism that converts into electric energy a displacement of a body part of an animal when the animal spontaneously moves,
an accumulation unit that accumulates the electric energy converted by said mechano-electric conversion mechanism,
a ring-shaped main body whose diameter changes as an end of the ring-shaped main body moves due to the displacement and which includes a rack formed on an outer surface of the ring-shaped main body, and
a gear that rotates as the rack moves due to a change in the diameter of said main body,
wherein said mechano-electric conversion mechanism includes a piezoelectric element to be deformed directly or indirectly by the displacement, and
wherein said piezoelectric element is formed into a cantilever, and said gear intermittently bends a movable end of said piezoelectric element in accordance with the rotation.

2. The electricity generation device according to of claim 1, further comprising a feed unit that externally outputs the electric energy accumulated by said accumulation unit.

3. An electricity collection system comprising:
an electricity generation device of claim 2;
a reception unit that receives the electric energy from said feed unit; and
an electricity collection unit for accumulating the electric energy received by said reception unit.

4. An electricity generation device for generating electricity using an animal as a source of power comprising:
a mechano-electric conversion mechanism that converts into electric energy a displacement of a body part of an animal when the animal spontaneously moves,
an accumulation unit that accumulates the electric energy converted by said mechano-electric conversion mechanism, and
a ring-shaped main body to be bent by the displacement,
wherein said mechano-electric conversion mechanism includes a piezoelectric element to be deformed directly or indirectly by the displacement, and
wherein said piezoelectric element has two ends attached to an outer surface of said ring-shaped main body to be bent in accordance with the bend of said ring-shaped main body.

5. The electricity generation device according to claim 4, further comprising a feed unit that externally outputs the electric energy accumulated by the accumulation unit.

6. An electricity collection system comprising:
an electricity generation device of claim 5,
a reception unit that receives the electric energy from said feed unit, and
an electricity collection unit for accumulating the electric energy received by said reception unit.

* * * * *